Figure 1:
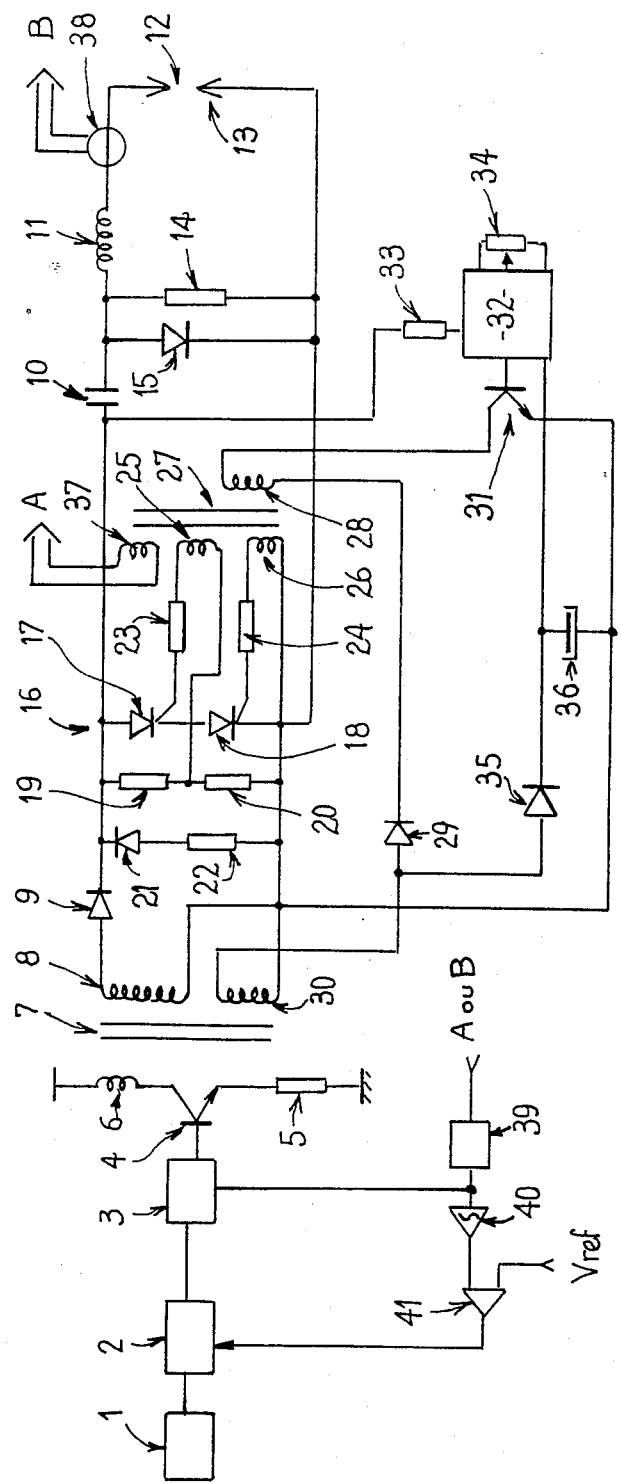

United States Patent [19]

Balland

[11] Patent Number: 4,983,886
[45] Date of Patent: Jan. 8, 1991

[54] HIGH-ENERGY IGNITION GENERATOR ESPECIALLY FOR A GAS-TURBINE

[75] Inventor: Patrick Balland, Rueil Malmaison, France

[73] Assignee: Labo Industrie, Nanterre Cedex, France

[21] Appl. No.: 408,557

[22] Filed: Sep. 18, 1989

[30] Foreign Application Priority Data

Sep. 20, 1988 [FR] France .................. 88 12272

[51] Int. Cl.⁵ .......................................... H05B 41/36
[52] U.S. Cl. .......................... 315/209 CD; 315/209 T; 361/257
[58] Field of Search ....... 315/209 CD, 209 T, 209 M, 315/209 SC, 242, 243; 361/257

[56] References Cited

U.S. PATENT DOCUMENTS

| | | | |
|---|---|---|---|
| 3,583,378 | 6/1971 | Pattee | 315/209 CD |
| 3,635,202 | 1/1972 | Issler et al. | 315/209 CD |
| 3,714,507 | 1/1973 | Schweitzer et al. | 315/209 CD |
| 4,133,329 | 1/1979 | Caron | 315/209 CD |
| 4,153,032 | 5/1979 | Chateau | 315/209 T |
| 4,244,337 | 1/1981 | Asai | 315/209 CD |
| 4,418,375 | 11/1983 | Ober | 315/209 T |
| 4,454,560 | 6/1984 | Nakao et al. | 361/257 |

Primary Examiner—Eugene R. LaRoche
Assistant Examiner—Son Dinh
Attorney, Agent, or Firm—Mason, Fenwick & Lawrence

[57] ABSTRACT

This high-energy ignition generator, especially for gas-turbines, of the type including an energy source (1) connected to a first circuit containing an energy storage capacitor (10), an inductor (11) and an ignition plug (12), in series, a free-wheel diode (15) being connected in parallel with the terminals of the inductor (11) and the ignition plug (12) and means of short-circuiting (16) the first circuit so as to generate sparks between the electrodes of the plug (12), is characterized in that the means of short-circuiting (16) include at least one semi-conductor switching device (17,18) controlled by means of comparison (32) of the voltage at the terminals of the storage capacitor (10) with a first reference voltage, and in that means of control (2,3,4,7; 39,40,41) of the charge of the capacitor (10) at a first rate during an initial period of time and at a second rate during a second period of time, the second rate being higher than the first, are interposed between the energy source (1) and the first circuit.

10 Claims, 2 Drawing Sheets

HIGH-ENERGY IGNITION GENERATOR ESPECIALLY FOR A GAS-TURBINE

The present invention relates to a high-energy ignition generator especially for a gas-turbine.

A certain number of generators of this type are already known in the state-of-the-art technology, including an energy source attached to a first circuit containing an energy storage capacitor, an inductor and an ignition plug, in series, a free-wheel diode being connected in parallel with the terminals of the inductor and of the plug and means of short-circuiting the first circuit so as to generate sparks between the electrodes of the plug.

In the state-of-the-art technology, the means of short-circuiting are constituted by a discharger formed for example by a gas discharge tube and which serves as a power switch and a reference voltage.

However, these devices have some inconveniences insofar as the discharger has a limited life and a very low efficiency.

The aim of the invention is therefore to resolve these problems by putting forward an ignition generator which is simple, reliable, offering an increased life in relation to that of the state-of-the-art devices, and being able to function at very high temperatures.

For this purpose, the subject of the invention is a high-energy ignition generator, especially for gas-turbines, of the type including an energy source connected to a first circuit comprising an energy storage capacitor, an inductor and an ignition plug, in series, a free-wheel diode being connected in parallel with the terminals of the inductor and of the plug and means of short-circuiting the first circuit so as to generate sparks between the electrodes of the plug, characterized in that the means of short-circuiting comprise at least one semi-conductor switching device controlled by means of comparison of the voltage at the terminals of the storage capacitor with a first reference voltage, and in that control means of the charge of the capacitor at a first rate during an initial period of time and at a second rate during a second period of time, the second rate being higher than the first, are interposed between the energy source and the first circuit.

Advantageously, the control means comprises a voltage-controlled oscillator, the input of which is connected to the energy source and the output of which is connected to a flip-flop controlling the supply to a primary winding of a transformer, a first secondary winding of which is connected to the said first circuit by rectification means, the voltage-controlled oscillator delivering trains of impulses having a first and second frequency which determine the first and second rates of charging the capacitor under the control of means of release depending on the frequency of the sparks between the electrodes of the plug.

Figure 2:
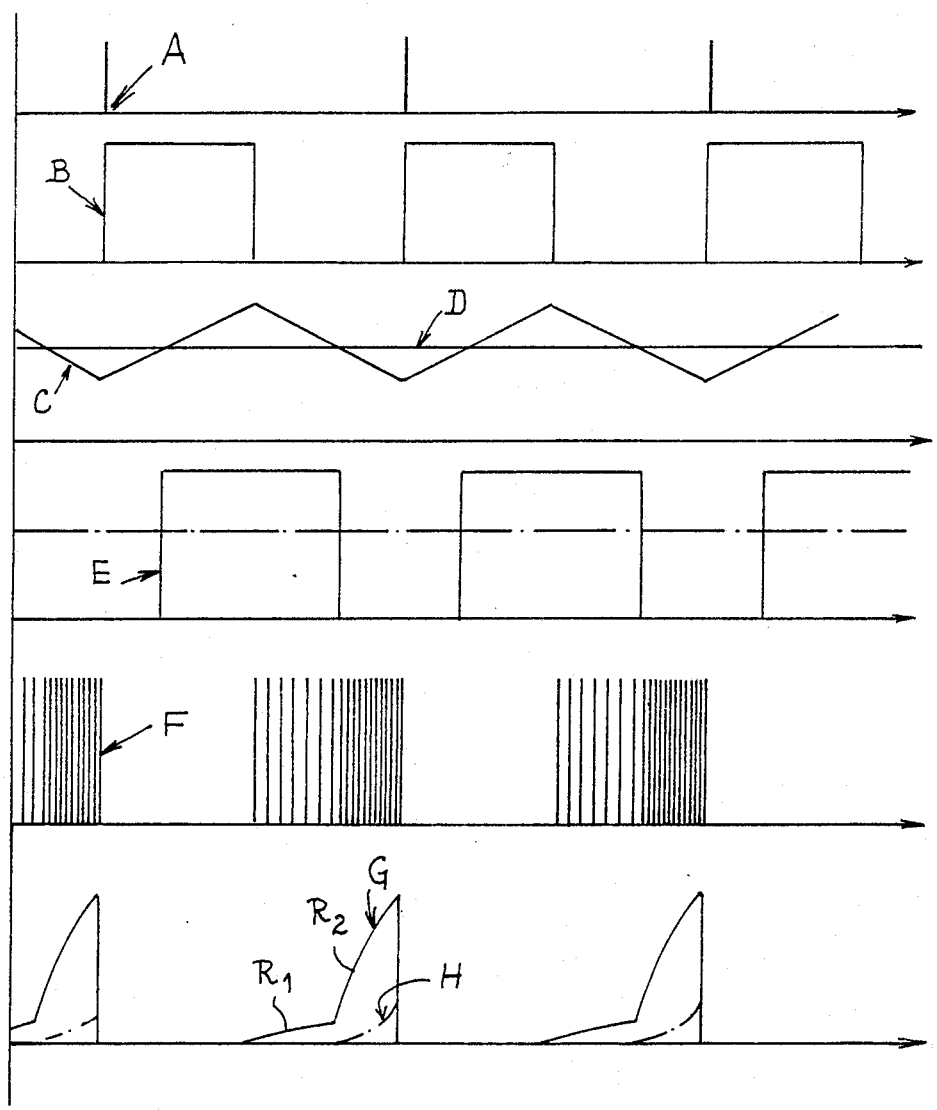

The invention will be better understood from the description which follows, given only as an example and made with reference to the attached drawings; on which FIG. 1 shows a schematic diagram of a high-energy ignition generator according to the invention; and FIG. 2 shows a timing diagram illustrating the functioning of the generator represented in FIG. 1.

As can be seen from FIG. 1, which shows a schematic diagram of a high-energy ignition generator, especially for gas-turbines, according to its invention, this includes an energy source 1 connected to the input of a voltage-controlled oscillator 2, of which the output is connected to a flip-flop 3. The output of this flip-flop is connected to the base of an NPN 4 transistor of which the emitter is connected to earth through a resistor 5 and the collector is connected to a terminal of a primary winding 6 of a transformer 7, the other terminal of this primary winding of the transformer being connected to the supply.

One of the terminals of a first secondary winding 8 of this transformer 7 is connected to the anode of a rectifier diode 9, the cathode of which is connected to a first circuit comprising an energy storage capacitor 10, an inductor 11 and an ignition plug 12, in series, the electrodes of this plug being designated by 13.

A resistor 14 and a free-wheel diode 15 are also connected in parallel with the terminals of the inductor 11 and the plug 12.

Means of short-circuiting 16 are also connected in parallel with the terminals of this first circuit so as to generate, in a manner known per se, sparks between the electrodes of the plug 12.

These short-circuiting means comprise at least one semi-conductor switching device, for example two thyristors 17 and 18 connected in series as shown on this Figure. Balancing resistors 19 and 20 are advantageously connected in parallel with the terminals of the thyristors 17 and 18 respectively, so as to balance this assembly. A diode 21 the cathode of which is connected to the cathode of diode 9, and a resistor 22 in series with this diode 21, are also connected to the terminals of these thyristors so as to constitute a protective circuit for these latter. The triggers of these thyristors 17 and 18 are respectively connected to resistors 23 and 24, which are respectively connected to the secondary windings 25 and 26 of an impulse-transformer 27. This impulse-transformer 27 has a primary winding 28, one of the terminals of which is connected to the cathode of a diode 29, the anode of which is connected to a terminal of a second secondary winding 30 of the transformer 7 mentioned previously.

The other terminal of the primary winding 28 of the impulse-transformer 27 is connected to the collector of an NPN transistor 31, the emitter of which is connected to the other terminal of the second secondary winding 30 of the transformer 7. The base of this NPN transistor 31 is connected to means of comparison 32 of the voltage at the terminals of the capacitor 10 with a first reference voltage.

For this purpose, one of the input terminals of these means of comparison 32 is connected to the input terminal of the capacitor 10 through a resistor 33 and these means of comparison are also connected to a potentiometer 34 for determining the first reference voltage.

These means of comparison 32 receive their supply from the second secondary winding 30 of the transformer 7 through a diode 35, a capacitor 36 connected to the cathode of this diode 35 and to the other terminal of this second secondary winding 30 ensuring a smoothing of the supply.

This part of the device functions as follows.

The voltage -controlled oscillator 2 generates trains of impulses applied to the flip-flop 3 which itself controls the supply to the primary winding 6 of the transformer 7 through the transistor 4. The first secondary winding 8 of the transformer then ensures, through the rectifier diode 9, the charging of the storage capacitor 10 until the image of the voltage at the terminals of the latter is at least equal to the reference voltage determined by the potentiometer 34, this comparison being ensured by the means of comparison 32.

Naturally, this reference voltage can also be delivered by any means depending on the temperature of the turbine, to make the energy of the sparks delivered by the generator dependent on the temperature of this turbine. This temperature is for example sampled by any suitable temperature sensor.

When the voltage at the terminals of the capacitor 10 is sufficient, the means of comparison 32 ensue the control of the impulse-transformer 27 through the transistor 31, in order to trigger the thyristors 17 and 18 and thus short-circuit the first circuit mentioned previously, so as to generate sparks between the electrodes of the plug 12.

It was noted during tests carried out at a very high temperature, of the order of 120° to 130° C. on turbines, that the thyristors because conductive and that a leakage current thus created brought about an additional temperature increase, degrading further their functioning.

In order to resolve these problems, the means of controlling the supply of the first circuit, that is, the components ensuring the supply of the transformer 7, are adapted to control the charge of the capacitor at a first rate during an initial period of time and at a second rate during a second period of time, the second rate being higher than the first.

Furthermore, these means are also dependent on the frequency of the sparks between the electrodes of the plug 12 by taking a signal at the frequency of the sparks either at the terminals of a third secondary winding 37 of the impulse transformer 27 at position A, or directly on the supply line of the plug 12 by the intermediary of a current-transformer 38, at position B.

One or other of these signals coming from components 37 or 38 described previously, is then sent to a flip-flop 39, the output of which is connected to an integrator 40. The output of this integrator is connected to a terminal of a comparator 41, the other terminal of which receives a second reference voltage. The output of this comparator 41 is connected to a control terminal of the voltage-controlled oscillator, these components constituting the means of releasing the oscillator 2.

The functioning of this part of the device is illustrated by the timing diagram shown in FIG. 2.

The sparks produced at the plug 12 are represented at A, these sparks supplying a frequency reference.

The output of the flip-flop 39 is represented by B, receiving on its input the signal represented at A. This input signal of the flip-flop comprises square pulses, the rising fronts of which correspond to the spark bursts between the electrodes of the plug 12. This signal is then integrated in the integration means 40 so as to form a saw-tooth signal represented at C. Furthermore, this output signal of the flip-flop 39 is also applied to the flip-flop 3 in order to block the functioning of the latter and of the components connected to its output.

This saw-tooth signal is compared in the comparator 41 with the second reference voltage represented at D in this FIG. 2 and applied to the other input of this comparator, so as to form, at the output of the comparator 41, a signal represented at E illustrating a signal having square pulses of a duration corresponding to the time during which the saw-tooth signal is greater than the second reference voltage.

It goes without saying that this second reference voltage can also be dependent on the temperature of the turbine, to make the frequency of the sparks delivered by the generator depend on the temperature of the turbine.

The output signal E of the comparator 41 is then applied to the voltage-controlled oscillator 2 so as to control the latter in order that during an initial period of time, in the presence of a square pulse in signal E and when the square pulse in signal B disappears, it emits pulses at an initial low, or even zero frequency, so as to ensure a charge at a relatively low or even zero rate of the energy storage capacitor 10, while, after the disappearance of the square pulse in signal E, the oscillator sends pulses at a second high frequency so as to accelerate the charge of the energy storage capacitor at a second rate, these pulses are represented at F in FIG. 2. This enables the charging of the energy storage capacitor 10 to be delayed and therefore the time to be reduced during which the leakage current of the thyristors is present in these latter, bringing about the least increase in their temperature.

Thus, as represented at G in this FIG. 2, the charging of the capacitor is ensured at a first rate R1 during an initial period of time and at a second rate R2 during a second period of time, this second rate being clearly higher than the first.

The leakage current of the thyristors illustrated at H in this Figure therefore only appears during the period of time while the rate of charge of the capacitor is R2, which limits the heating of the thyristors.

Furthermore, the dependence on the temperature of the turbine of the energy and the frequency of the sparks delivered by the generator also permits the limitation of the heating of the thyristors from this.

It goes without saying that although there has been represented at C a balanced saw-tooth signal, unbalanced signals can also be used to very the first and second periods of time for the charging of the capacitor.

I claim:

1. High-energy ignition generator of the type including an energy source (1) connected to a first circuit comprising an energy storage capacitor (10), an inductor (11) and an ignition plug (12), in series, a free-wheel diode (15) being connected in parallel with the terminals of the inductor (11) and the ignition plug (12) and means of short-circuiting (16) the first circuit so as to generate sparks between the electrodes of the plug (12), characterized in that the means of short-circuiting (16) include at least one semi-conductor switching device (17,18) controlled by means for comparison (32) of the voltage at the terminals of the storage capacitor (10) with a first reference voltage, and in that means of control (2,3,4,7; 39,40,41) of the charging of the capacitor (10) at a first rate (R1) during an initial period of time and at a second rate (R2) during a second period of time, the second rate being higher than the first, are interposed between the energy source (1) and the first circuit.

2. Generator according to claim 1, characterized in that the control means comprises a voltage-controlled oscillator (2) the input of which is connected to the energy source (1) and the output of which is connected to a first flip-flop (3) controlling the supply of a primary winding (6) of a transformer (7) a first secondary winding (8) of which is connected to the first circuit through rectification means (9), the voltage-controlled oscillator (2) delivering trains of impulses having first and second frequencies which determine the first and second rates (R1,R2) of charging the capacitor (10) under the control of means of release (37,38,39; 40,41) depending on the frequency of the sparks between the electrodes of the plug (12).

3. Generator according to claim 2, characterized in that the means of release comprises means for determining the frequency of the sparks (37,38), connected to a second flip-flop (39), the output of which is connected to integration means (40) and to the first flip-flip (3), the output of these integration means (40) being connected to an input terminal of a comparator (41), the other input terminal of which receives a second reference voltage, and the output of which is connected to a control input of the voltage-controlled oscillator (2), so as to control the emission by this of impulses at the first and second frequencies as a function of the result of the comparison.

4. Generator according to claim 3, characterized in that the means for determining the frequency of the sparks comprises a current transformer (38) connected on the supply line of the plug (12).

5. Generator according to claim 3, characterized in that the means for determining the frequency of the sparks comprises a secondary winding (37) of an impulse-transformer (27) of which at least one other secondary winding (25,26) is connected to the control terminal of the semi-conductor switching device (17,18), the primary winding (28) of this impulse-transformer (27) being connected to the means for comparison (32) of the voltage at the terminals of the storage capacitor (10) with the first reference voltage.

6. Generator according to claim 1, characterized in that the semi-conductor switching device is a thyristor (17,18).

7. Generator according to claim 6, characterized in that it comprises two thyristors (17,18) connected in series.

8. Generator according to claim 1, characterized in that the first rate is zero.

9. Generator according to claim 1, characterized in that the first reference voltage is dependent on the temperature of the turbine.

10. Generator according to claim 3, characterized in that the second

* * * * *

UNITED STATES PATENT AND TRADEMARK OFFICE
CERTIFICATE OF CORRECTION

PATENT NO.  :  4,983,886
DATED       :  January 8, 1991
INVENTOR(S) :  Patrick Balland It is certified that error appears in the above-identified patent and that said Letters Patent is hereby corrected as shown below:

Column 6, line 21, after "second" insert -- reference
   voltage is dependent on the temperature of the
   turbine.--

Signed and Sealed this

Twenty-first Day of July, 1992

*Attest:*

DOUGLAS B. COMER

*Attesting Officer*        Acting Commissioner of Patents and Trademarks